United States Patent [19]
Okamoto

[11] Patent Number: 5,828,109
[45] Date of Patent: Oct. 27, 1998

[54] SEMI-CONDUCTOR INTEGRATED CIRCUIT DEVICE

[75] Inventor: Hitoshi Okamoto, Tokyo, Japan

[73] Assignee: NEC Corporation, Tokyo, Japan

[21] Appl. No.: 827,087

[22] Filed: Mar. 27, 1997

[51] Int. Cl.[6] .............................. H01L 29/06; H01L 29/78
[52] U.S. Cl. ........................ 257/372; 257/369; 257/370
[58] Field of Search .................................. 257/369, 370, 257/372

[56] References Cited

U.S. PATENT DOCUMENTS

| | | | |
|---|---|---|---|
| 5,049,967 | 9/1991 | Watanabe et al. | 257/372 |
| 5,055,903 | 10/1991 | Wichmann | 257/372 |
| 5,087,957 | 2/1992 | Ishimura et al. | 257/372 |
| 5,446,303 | 8/1995 | Quill et al. | 257/360 |

*Primary Examiner*—Valencia Wallace
*Attorney, Agent, or Firm*—Sughrue, Mion, Zinn, Macpeak & Seas, PLLC

[57] ABSTRACT

In a semi-conductor integrated circuit device, electric charges which relate to latch-up phenomenon generation are absorbed effectively, and thereby generation of the latch-up phenomenon is prevented. Low-concentration impurity diffusion layers of I/O transistor within I/O transistor region are electrically connected to high-concentration impurity diffusion layers with different conductive characteristics each. Furthermore, low-concentration impurity diffusion layers of internal circuit transistors within internal circuit transistor region are electrically connected to high-concentration impurity diffusion layers with different conductive characteristics each, or are brought into directly contact therewith, thus electrically connecting thereto. For this reason, it causes an observed area of the low-concentration impurity diffusion layer of the transistors to enlarge, thus absorbing the electric charges causing the latch-up phenomenon generation.

14 Claims, 3 Drawing Sheets

INTERNAL TRANSISTOR REGION

I/O TRANSISTOR REGION 9 | INTERNAL TRANSISTOR REGION 10

SEMI-CONDUCTOR INTEGRATED CIRCUIT DEVICE

BACKGROUND OF THE INVENTION

The present invention relates to a semi-conductor integrated circuit device, and in particular to a CMOS-type (complementary metal oxide semiconductor type) semi-conductor integrated circuit whose latch-up phenomenon resistance is improved.

DESCRIPTION OF THE PRIOR ART

The latch-up phenomenon had been often generated in the conventional CMOS-type semi-conductor integrated circuit. The latch-up phenomenon of FIG. 1 is the latch-up phenomenon caused by external environment of the semi-conductor integrated circuit. To the latch-up phenomenon of this type, there is provided a guard ring region 22. An I/O transistor performs inputting-outputting of signal between the semi-conductor integrate circuit and an external circuit. The I/O transistor exists on the I/O transistor region 20. An internal transistor exists on an internal transistor region 21. The guard ring region 22 is composed both of low-concentration impurity diffusion layer and high-concentration impurity diffusion layer. The guard ring region 22 is provided so as to surround the internal transistor region 21 between the I/O transistor region 20 and the internal transistor region 21.

Furthermore, the latch-up phenomenon also appears caused by internal operation within the internal transistor region 21. To the latch-up phenomenon of this type, as shown in FIG. 2, there is provided a sub-contact or a well-contact 23. The sub-contact or well-contact is formed in such a way that high-concentration impurity diffusion layer is dissipated in the separated low-concentration impurity diffusion layer of each internal transistor within the internal transistor region 21.

These guard ring region 22, sub-contact or well-contact 23 are connected to voltage source VDD or VSS which is the same electric potential as that of reference electric potential of each transistor of N-type or P-type. These guard ring region 22, and the sub-contact or well-contact 23 absorb the electric charges caused by the latch-up phenomenon which electric charges penetrate the internal transistor region 21 from the external region, or which electric charges are generated on the internal transistor region 21. The electric-charge-absorption of this type causes the reference electric potential of each transistor to stabilize. The latch-up phenomenon is prevented in such a way that it causes a parasitic bipolar transistor which comes into a trigger of the latch-up phenomenon not to operate.

In these conventional latch-up phenomenon preventing measures, a preventing measure of FIG. 1 copes with the latch-up phenomenon caused by external environment of the semi-conductor integrated circuit. In this preventing measure, the electric charge which are not absorbed by the guard ring region 22 are often poured into the internal transistor region 21. In such the case, there is a problem that the latch-up phenomenon is generated by these electric charges. Furthermore, the guard ring region 22 can exercise the effect of preventing the latch-up phenomenon when the guard ring region 22 is positioned at a distance of prescribed length between the I/O transistor region 20 and the internal transistor region 21. For this reason, there is a limit to lessen the distance between the I/O transistor region 20 and the internal transistor region 21. It is prevented to miniaturize the size thereof when it makes these elements as a whole integrated circuit. A preventing measure of FIG. 2 copes with the latch-up phenomenon caused by internal operation of the semi-conductor integrated circuit. A preventing measure of this type, it is necessary that it allows the sub-contact or well-contact to form on the low-concentration impurity diffusion layer which is separated in every transistor. The increase of the number of the sub-contact or well-contact brings about reduction of an area of functional section of the transistor, thus causing functional deterioration thereof. There is a limit that the number of the sub-contact or well-contact is not increased. It becomes impossible that the sub-contact or well-contact evenly absorbs latching-up electric charge for every transistor. Consequently, this is not enough as the latch-up phenomenon preventing measure.

SUMMARY OF THE INVENTION

In view of the foregoing, it is an object of the present invention, to provide a semi-conductor integrated circuit device which effectively absorbs the electric charges pertaining to the latch-up phenomenon generation by virtue of enlarging an observed area of low-concentration impurity diffusion layer which absorbs the electric charges pertaining to the latch-up phenomenon generation.

According to one aspect of the present invention, for achieving the above-mentioned object, there is provided a semi-conductor integrated circuit device which has following elements: There is provided a set of grouped transistors in which a type of conductive characteristics thereof is different from each grouped transistors, and which are provided to be adjacent to each other. There is provided a diffusion member for forming absorption-area of electric charges in cooperation with a low-concentration diffusion layer. There is provided extension means for connecting said low-concentration diffusion layer of the same electric potential in said set of grouped transistors with a voltage source of the same electric potential, whereby it causes an observed area of the low-concentration diffusion layer to enlarge.

According to another aspect of the present invention, there is provided a semi-conductor integrated circuit device wherein a contact couples the diffusion member to the low-concentration diffusion layer.

According to another aspect of the present invention, there is provided a semi-conductor integrated circuit device, wherein the diffusion member is brought into contact with the low-concentration diffusion layer to couple thereto.

According to another aspect of the present invention, there is provided a semi-conductor integrated circuit device, wherein the diffusion member consists of a high-concentration diffusion layer whose concentration is different from that of the low-concentration diffusion layer.

According to another aspect of the present invention, there is provided a semi-conductor integrated circuit device, wherein the diffusion member consists of a low-concentration diffusion layer which has the same concentration as that of the low-concentration diffusion layer.

According to another aspect of the present invention, there is provided a semi-conductor integrated circuit device, wherein the extension means consists of a wiring with low resistance value.

As described above, according to the present invention, it allows the low-concentration impurity diffusion layer with the same electric potential of the semi-conductor integrated circuit to connect electrically or in terms of an area, thus forming an enlarged low-concentration impurity diffusion layer. The electric charges which relates to the generation of the latch-up phenomenon are effectively absorbed. Thus it intends the semi-conductor integrated circuit to absorb the electric charges which relates to the latch-up phenomenon.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

DETAILED DESCRIPTION OF THE PREFERRED EMBODIMENT

A preferred embodiment of the invention will now be described in detail referring to the accompanying drawings.

Figure 3:
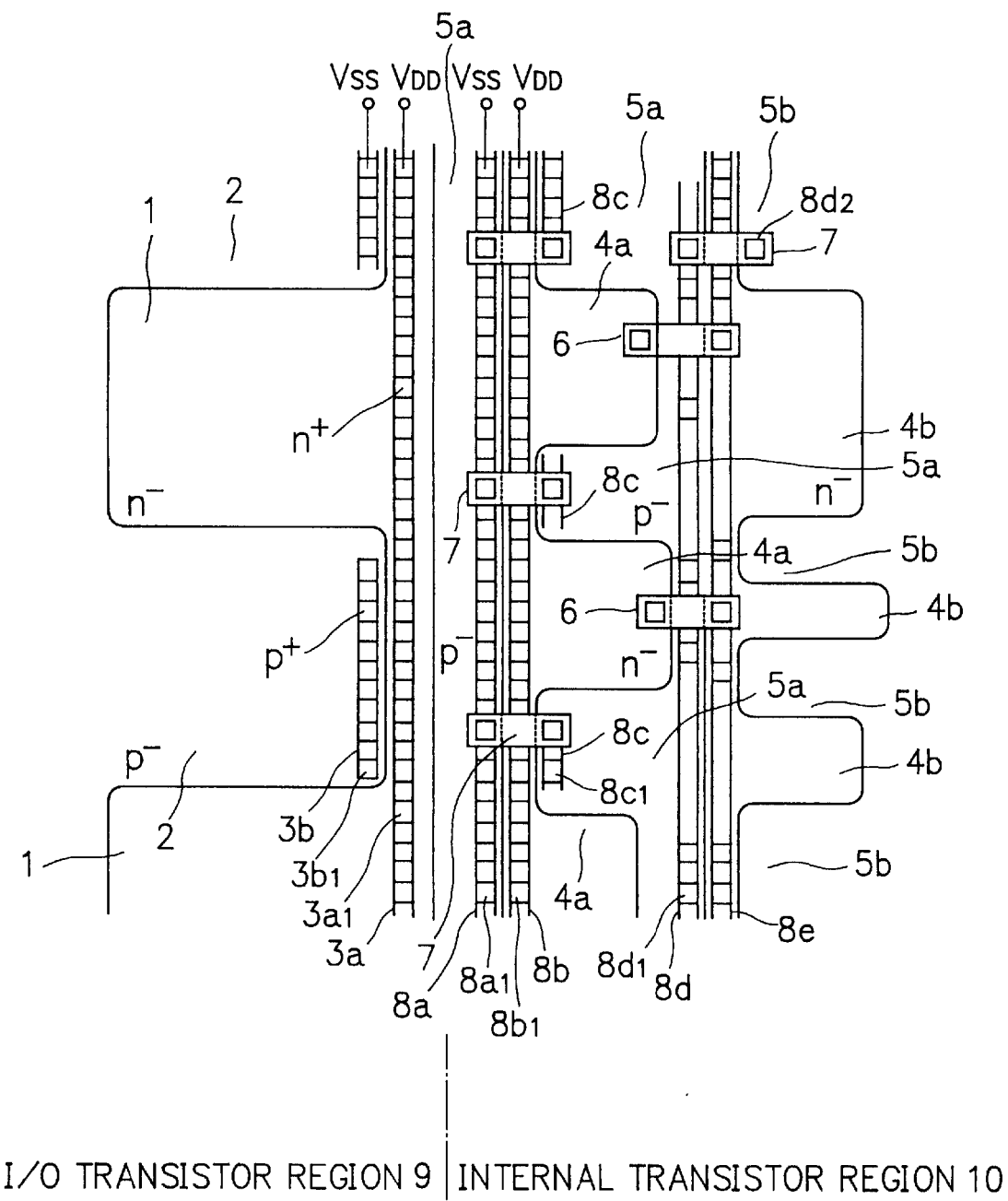
FIG. 3 is a plan view showing an embodiment according to the present invention.

FIG. 3 is a plan view showing one embodiment of the present invention. In FIG. 3, an I/O transistor region 9 and an internal transistor region 10 are formed to be adjacent thereto. The I/O transistor region 9 performs inputting-outputting of signals between the internal transistor region 10 and an external circuit. P-type I/O transistor and N-type I/O transistor having different type of conductive characteristics each are mixed in the I/O transistor region 9. N-type low-concentration impurity diffusion layer 1 of the P-type I/O transistor and P-type low-concentration impurity diffusion layer 2 of N-type I/O transistor are provided to be adjacent to the side which is faced to the internal transistor region 10.

In the N-type low-concentration impurity diffusion layer 1 of the I/O transistor region 9, an N-type high-concentration impurity diffusion layer 3a is formed as long and narrow as belt-shape. The N-type low-concentration impurity diffusion layer 1 has the same reference electric potential of the P-type I/O transistor as that of the N-type high-concentration impurity diffusion layer 3a. The N-type low-concentration impurity diffusion layer 1 is electrically connected to N-type high-concentration impurity diffusion layer 3a through a contact 3a1. The N-type high-concentration impurity diffusion layer 3a is connected to a voltage source VDD whose electric potential is the same potential as that of the N-type high-concentration impurity diffusion layer 3a.

Furthermore, in the P-type low-concentration impurity diffusion layer 2 of the I/O transistor region 9, P-type high-concentration impurity diffusion layer 3b is formed as long and narrow as the belt-shape avoiding the above-described N-type low-concentration impurity diffusion layer 1. The P-type low-concentration impurity diffusion layer 2 has the same reference electric potential of the N-type I/O transistor as that of the P-type high-concentration impurity diffusion layer 3b. The P-type low-concentration impurity diffusion layer 2 is electrically connected to the P-type high-concentration impurity diffusion layer 3b through a contact 3b1. The P-type high-concentration impurity diffusion layer 3b is connected to a voltage source VSS which has the same electric potential as that of the P-type high-concentration impurity diffusion layer 3b.

As described above, in the I/O transistor region 9, the type of conductive characteristics of the N-type low-concentration impurity diffusion layer 1 of the P type I/O transistor is different from that of the P-type low-concentration impurity diffusion layer 2 of the N-type I/O transistor. The N-type low-concentration impurity diffusion layer 1 is electrically connected to the N-type high-concentration impurity diffusion layer 3a having the same electric potential of the N-type low-concentration impurity diffusion layer 1. The P-type low-concentration impurity diffusion layer 2 is electrically connected to the P-type high-concentration impurity diffusion layer 3b having the same electric potential of the P-type low-concentration impurity diffusion layer 2. By these connections, an observed area of the low-concentration impurity diffusion layer is increased, with the result that the electric charges which come into cause of the latch-up phenomenon generated on the I/O transistor region 9 are absorbed.

Figure 1:
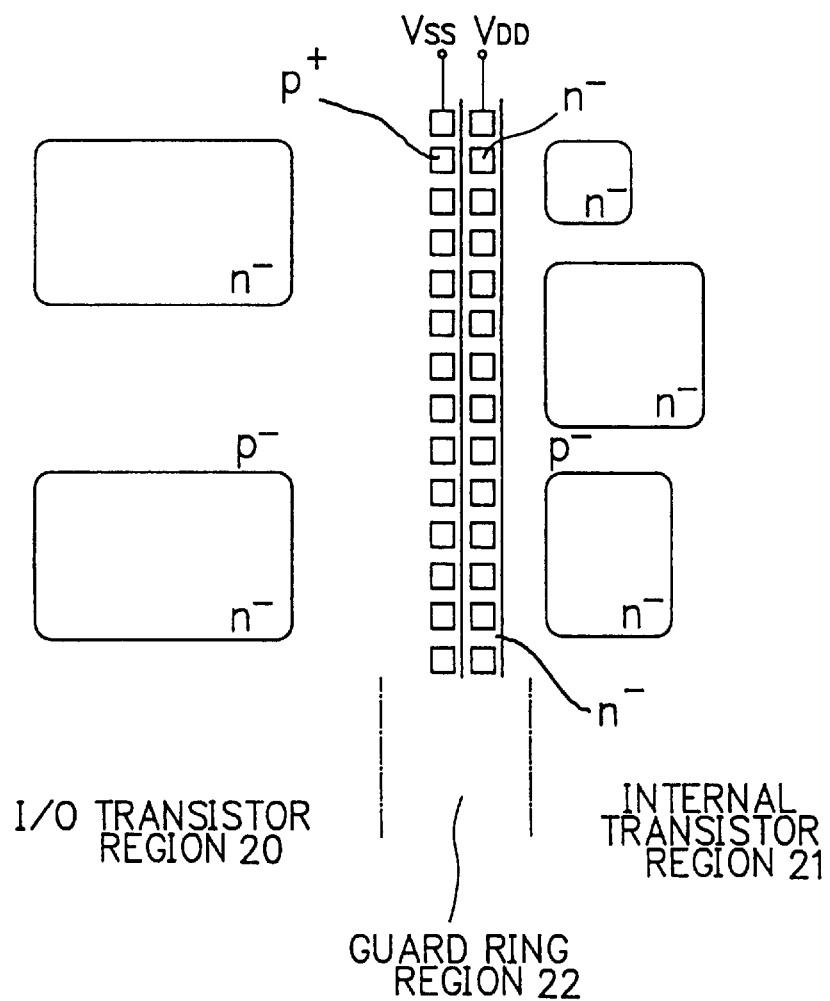
FIG. 1 is a plan view showing the guard ring region provided between the I/O transistor region and the internal circuit transistor region according to the conventional example.
Figure 2:
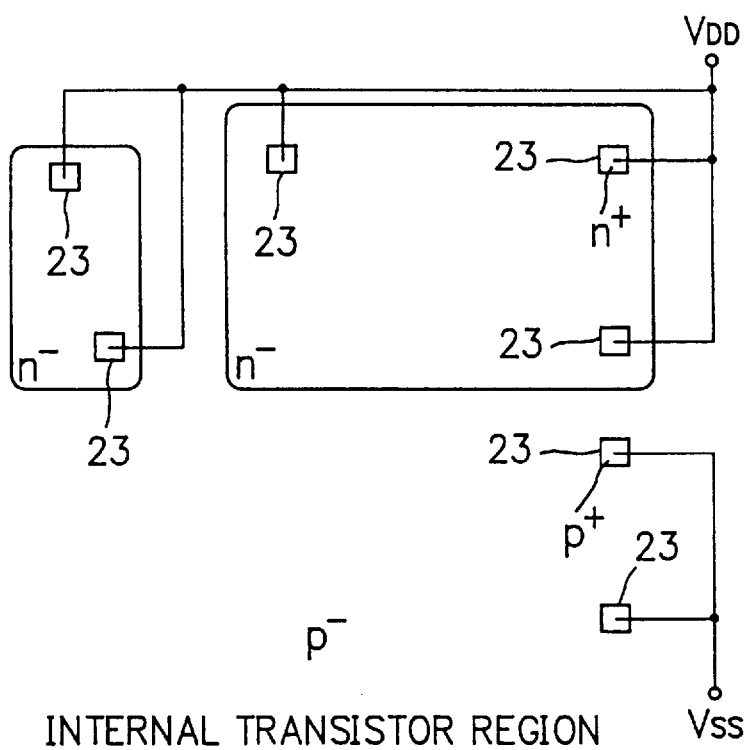
FIG. 2 is a plan view showing a mechanism of the electric charge absorption in the internal circuit transistor region according to the conventional example.

Next, the latch-up phenomenon preventing measure pertaining to the internal transistor region 10 will be described. The internal transistor region 10 performs the signal transmitting-receiving through the I/O transistor region 9 between the external circuit, thus performing the signal processing. An internal circuit P-type transistor and an internal circuit N-type transistor are mixed in the internal transistor region 10. The type of conductive characteristics of the internal circuit P-type transistor is different from that of the internal circuit N-type transistor. An N-type low-concentration impurity diffusion layer 4a of the internal circuit P-type transistor and a P-type low-concentration impurity diffusion layer 5a of the internal circuit N-type transistor are provided to be adjacent to the side faced to the I/O transistor region 9. Furthermore, an N-type low-concentration impurity diffusion layer 4b of the internal circuit P-type transistor and a P-type low-concentration impurity diffusion layer 5b of the internal circuit N-type transistor are provided to be arranged being adjacent to rear side (right side of FIG. 1) of each of N-type low-concentration impurity diffusion layer 4a and P-type low-concentration impurity diffusion layer 5a.

Furthermore, in the region of the P-type low-concentration impurity diffusion layer 5a of the internal circuit N-type transistor provided on the first part of the internal transistor region of the internal transistor region 10 faced to the I/O transistor region 9, P-type high-concentration impurity diffusion layers 8a, 8c, and 8d are formed as long and narrow as the belt-shape. The P-type low-concentration impurity diffusion layer 5a has the same reference electric potential of the internal circuit N-type transistor as that of the P-type high-concentration impurity diffusion layer 8a. The P-type low-concentration impurity diffusion layer 5a is electrically connected to the P-type high-concentration impurity diffusion layer 8a through a contact 8a1. The P-type high-concentration impurity diffusion layer 8a is connected to the voltage source VSS which has the same electric potential as that of the P-type high-concentration impurity diffusion layer 8a. The P-type low-concentration impurity diffusion layer 5a is electrically connected to the P-type high-concentration impurity diffusion layer 8c through a contact 8c1. The P-type high-concentration impurity diffusion layer 8c is electrically connected to the P-type high-concentration impurity diffusion layer 8a by means of a low resistance wiring 7.

Furthermore, in the region of the N-type low-concentration impurity diffusion layer 4a of the internal circuit P-type transistor provided on the first part of the internal transistor region of the internal transistor region 10 faced to the I/O transistor region 9, N-type high-concentration impurity diffusion layers 8b is formed as long and narrow as the belt-shape. The N-type low-concentration impurity diffusion layer 4a has the same reference electric potential of the internal circuit P-type transistor as that of the N-type high-concentration impurity diffusion layer 8b. The N-type low-concentration impurity diffusion layer 4a is electrically connected to the N-type high-concentration impurity diffusion layer 8b through a contact 8b1. The N-type high-concentration impurity diffusion layer 8b is connected to the voltage source VDD which has the same electric potential as that of the N-type high-concentration impurity diffusion layer 8b.

There is provided the internal circuit N-type transistor for a rear internal transistor region falls within backward of the first part internal transistor region. The P-type low-concentration impurity diffusion layer 5b has the same reference electric potential of the internal circuit N-type transistor provided on the rear internal transistor region as that of the P-type high-concentration impurity diffusion layer 5d. The P-type low-concentration impurity diffusion layer 5b is electrically connected to the P-type high-concentration impurity diffusion layer 8d through a contact 8d2 and a wiring 7 with the low resistance value. The P-type high-concentration impurity diffusion layer 8d is electrically connected to the P-type high-concentration impurity diffusion layer 8a having the same electric potential as that of the P-type high-concentration impurity diffusion layer 8d through the contact 8d1, the P-type low-concentration impurity diffusion layer 5a, the contact 8c1, the P-type high-concentration impurity diffusion layer 8c, the low resistance wiring 7, and the P-type high-concentration impurity diffusion layer 8a, thus being connected to the voltage source VSS.

There is provided the N-type low-concentration impurity diffusion layer 4b of the internal circuit P-type transistor in the rear internal transistor region. The N-type high-concentration impurity diffusion layer 8e is provided such that the N-type low-concentration impurity diffusion layer 4b is directly brought into contact therewith. The N-type high-concentration impurity diffusion layer 8e of the internal circuit P-type transistor is connected to the N-type low-concentration impurity diffusion layer 4a through the low resistance wiring 6 with a low resistance value. The N-type high-concentration impurity diffusion layer 8e is electrically connected to the voltage source VDD by the N-type high-concentration impurity diffusion layer 8b.

As described above, in the internal transistor region 10, the N-type high-concentration impurity diffusion layer 8b is connected to the N-type low-concentration impurity diffusion layer 4a, thus being connected to the voltage source VDD, while the P-type high-concentration impurity diffusion layer 8a is connected to P-type low-concentration impurity diffusion layer 5a thus being connected to the voltage source VSS. For this reason, it is capable of absorbing the electric charges caused by the latch-up phenomenon generated on the first part of the internal transistor region.

In the latter part of the internal transistor region, the P-type high-concentration impurity diffusion layer 8d is electrically connected to the P-type low-concentration impurity diffusion layer 5b. The N-type high-concentration impurity diffusion layer 8e is formed such that the N-type high-concentration impurity diffusion layer 8e brings into directly contact with the N-type low-concentration impurity diffusion layer 4b. For this reason, an observed area of each of the low-concentration diffusion layers is increased. As a result, the electric charges which relates to the latch-up phenomenon in the latter part of the internal circuit transistor region are absorbed.

In this embodiment, the low-concentration impurity diffusion layer instead of the high-concentration impurity diffusion layer can be employed for obtaining the same effect. Furthermore, transistors which are to be connected to the low resistance wires 6 and 7 are arranged in plural steps along the right and left of figure. This is not restricted in this arrangement.

In this embodiment, the concentration of the low-concentration impurity diffusion layer is established less than $1.0 \text{ E } 17 \text{ cm}^{-3}$, and the concentration of high-concentration impurity diffusion layer is established more than $1.0 \text{ E } 20 \text{ cm}^{-3}$. However, these are not limited of these numeral values.

As described above, the present invention allows the low-concentration impurity diffusion layer with the same electric potential of the semi-conductor integrated circuit to enlarge in terms of an area or to connect electrically, thus forming an enlarged low-concentration impurity diffusion layer. The electric charges which cause the generation of the latch-up phenomenon are effectively absorbed. The electric potential of the low-concentration impurity diffusion layer is capable of stabilizing, with the result that the latch up can be prevented.

Furthermore, there is the effect that the guard ring is capable of removing because the absorption of electric charges is improved.

While preferred embodiments of the invention have been described using specific terms, such description is for illustrative purposes only, and it is to be understood that changes and variations may be made without departing from the spirit or scope of the following claims.

What is claimed is:

1. A semi-conductor integrated circuit device comprising:
   a plurality of first low concentration impurity diffusion layer areas of a first conduction type;
   a second low concentration impurity diffusion layer of a second complementary conduction type surrounding said first low concentration impurity diffusion layer areas such that said first low concentration impurity diffusion layer areas form islands within said second low concentration impurity diffusion layer;
   a first transistor configuration group comprising a plurality of first transistors scattered within said plurality of first low concentration impurity diffusion layer areas, wherein each of said first transistors includes a high concentration impurity diffusion layer area of said second conduction type within one of said plurality of first low concentration impurity diffusion layer areas;
   a second transistor configuration group comprising a plurality of second transistors that are scattered within said second low concentration impurity diffusion layer, wherein each of said second transistors includes a high concentration impurity diffusion layer area of said first conduction type; and
   an extension means for connecting at least two of said plurality of low-concentration impurity diffusion layer areas whereby an observed area of low concentration diffusion is enlarged.

2. A semi-conductor integrated circuit device according to claim 1, wherein said plurality of first low concentration impurity diffusion layer areas and each of said first transistors are connected to a first voltage terminal.

3. A semi-conductor integrated circuit device according to claim 1, further comprising:

a first high concentration impurity diffusion layer, of said first conduction type, located near at least one of said first low concentration impurity diffusion layer areas and connected thereto by a first contact;

a second high concentration impurity diffusion layer, of said first conduction type, located near at least one of said first low concentration impurity diffusion layer areas and connected thereto by a second contact; and a low resistance wire connected to said first high concentration impurity diffusion layer and said second high concentration impurity diffusion layer.

4. A semi-conductor integrated circuit device according to claim 3, further comprising a first voltage terminal connected to said second high concentration impurity diffusion layer.

5. A semi-conductor integrated circuit device according to claim 4, further comprising:

a third high concentration impurity diffusion layer, of said second conduction type, located near said second low concentration impurity diffusion layer and connected thereto by a third contact;

a fourth high concentration impurity diffusion layer, of said second conduction type, located near said second low concentration impurity diffusion layer and connected thereto by a fourth contact; and a low resistance wire connected to said fourth high concentration impurity diffusion layer and directly to at least one of said first low concentration impurity diffusion layer areas.

6. A semi-conductor integrated circuit device according to claim 5, further comprising a second voltage terminal connected to said third high concentration impurity diffusion layer.

7. A semi-conductor integrated circuit device according to claim 6, wherein said first voltage terminal is a supply and said second voltage terminal is a drain.

8. A semi-conductor integrated circuit device according to claim 7, wherein said first conduction type is P-type conduction and said second conduction type is N-type conduction.

9. A semi-conductor integrated circuit device according to claim 5, wherein at least one of said first transistors and at least one of said second transistors comprise an internal transistor region, and the semi-conductor integrated circuit device further comprises an input/output transistor region abutting said internal transistor region.

10. A semiconductor integrated circuit as claimed in claim 2, wherein said second low concentration impurity diffusion layer and each of said second transistors are connected to a second voltage terminal.

11. A semiconductor integrated circuit as claimed in claim 10, wherein said first voltage terminal is a drain, and said second voltage terminal is a supply.

12. A semiconductor integrated circuit as claimed in claim 1, further comprising:

a first belt comprised of a low concentration impurity diffusion layer of a first conduction type, wherein said first belt connects a first group of said plurality of first low concentration impurity diffusion areas;

a second belt comprised of a low concentration impurity diffusion layer of said first conduction type, wherein said second belt connects a second group of said plurality of first low concentration impurity diffusion layer areas;

a third belt comprised of a low concentration impurity diffusion layer of said second conduction type;

wherein said second low concentration impurity diffusion layer of said second complementary conduction type is formed as a fourth belt and is located between said first belt and said second belt;

wherein said second belt is located between said fourth belt and said third belt; and a low resistance conductor connected to said third belt and to said fourth belt.

13. A semiconductor integrated circuit as claimed in claim 12, further comprising a second low resistance conductor connecting said first belt to said second belt.

14. A semi-conductor integrated circuit device according to claim 1, wherein said extension means consists of a wiring with low resistance value.

* * * * *